United States Patent
Gilbert

(10) Patent No.: US 9,195,782 B2
(45) Date of Patent: Nov. 24, 2015

(54) SYSTEM AND METHOD FOR COMBINING INPUT TOOLS INTO A COMPOSITE LAYOUT

(71) Applicant: Andrew Charles Kerry Gilbert, Devon (GB)

(72) Inventor: Andrew Charles Kerry Gilbert, Devon (GB)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 184 days.

(21) Appl. No.: 13/927,960

(22) Filed: Jun. 26, 2013

(65) Prior Publication Data

US 2015/0007071 A1   Jan. 1, 2015

(51) Int. Cl.
*G06F 17/50* (2006.01)
*G06F 3/0486* (2013.01)

(52) U.S. Cl.
CPC .............. *G06F 17/50* (2013.01); *G06F 3/0486* (2013.01)

(58) Field of Classification Search
CPC ........ G06F 3/0481; G06F 3/0486; G09G 5/14
USPC ................................................. 715/765, 788
See application file for complete search history.

(56) References Cited

U.S. PATENT DOCUMENTS

| | | | |
|---|---|---|---|
| 5,926,825 A | 7/1999 | Shirakawa | |
| 6,000,945 A | 12/1999 | Sanchez-Lazer et al. | |
| 6,448,518 B1 | 9/2002 | Martin et al. | |
| 6,772,144 B2 | 8/2004 | Brid et al. | |
| 7,079,221 B2 | 7/2006 | Tanaka | |
| 7,103,434 B2* | 9/2006 | Chernyak et al. | 700/98 |
| 7,120,868 B2 | 10/2006 | Salesin et al. | |
| 7,167,635 B1 | 1/2007 | Ando et al. | |
| 7,246,311 B2 | 7/2007 | Bargeron et al. | |
| 7,434,164 B2 | 10/2008 | Salesin et al. | |
| 7,444,597 B2* | 10/2008 | Perantatos | G06F 3/0486 715/770 |
| 7,568,154 B2 | 7/2009 | Salesin et al. | |
| 7,710,420 B2 | 5/2010 | Nonclercq et al. | |
| 7,751,586 B2 | 7/2010 | Matsubara | |
| 7,756,154 B2 | 7/2010 | Zayas | |
| 7,770,109 B2 | 8/2010 | Fortes | |
| 7,801,358 B2 | 9/2010 | Furmaniak et al. | |
| 7,831,579 B2 | 11/2010 | Wade et al. | |
| 7,840,295 B2 | 11/2010 | Thibaud | |
| 7,853,899 B1 | 12/2010 | Damaschke et al. | |
| 7,890,452 B2 | 2/2011 | Moore et al. | |
| 7,899,249 B2 | 3/2011 | Furmaniak et al. | |
| 7,912,291 B2 | 3/2011 | Berkner et al. | |
| 7,925,985 B2 | 4/2011 | Moore | |
| 7,940,901 B2 | 5/2011 | Paraskevakos et al. | |
| 7,949,725 B2 | 5/2011 | Yano | |
| 7,952,302 B2 | 5/2011 | Becattini et al. | |
| 7,973,788 B2 | 7/2011 | Nonclercq et al. | |
| 8,001,529 B2 | 8/2011 | Babut et al. | |

(Continued)

*Primary Examiner* — Haoshian Shih

(57) ABSTRACT

Various disclosed embodiments include methods, systems, and computer-readable media for combining input tools into a composite layout. A method includes receiving a first tool in a content area of a display, and dynamically adjusting a layout that includes first content associated with the first tool based on a location on a grid associated with the content area into which the first tool is received. The method may include receiving additional tools in the content area, dynamically adjusting the layout based on content associated with the additionally received tools and on a location on the grid associated with the content area into which each of the additional tools is received, and linking two or more tools to form linked tools configured to share context.

20 Claims, 6 Drawing Sheets

(56) References Cited

U.S. PATENT DOCUMENTS

| | | |
|---|---|---|
| 8,030,566 B2 | 10/2011 | Ludwig |
| 8,030,567 B2 | 10/2011 | Ludwig |
| 8,032,635 B2 | 10/2011 | Moore |
| 8,035,024 B2 | 10/2011 | Ludwig |
| 8,082,497 B2 | 12/2011 | Salesin et al. |
| 8,090,612 B2 | 1/2012 | Chao et al. |
| 8,090,719 B2 | 1/2012 | Wade et al. |
| 8,091,021 B2 | 1/2012 | Bargeron et al. |
| 8,120,572 B2 | 2/2012 | Chu et al. |
| 8,127,227 B1 | 2/2012 | Kates et al. |
| 8,140,279 B2 | 3/2012 | Subbloie |
| 8,140,817 B2 | 3/2012 | Schopp et al. |
| 8,150,179 B2 | 4/2012 | Yano |
| 8,166,412 B2 | 4/2012 | Jain et al. |
| 8,179,713 B2 | 5/2012 | Kanzawa et al. |
| 8,195,493 B2 | 6/2012 | Goldberg et al. |
| 8,214,239 B2 | 7/2012 | Goldberg et al. |
| 2003/0222912 A1* | 12/2003 | Fairweather ............ 345/763 |
| 2007/0291036 A1* | 12/2007 | McArdle ............ G06T 19/00 345/441 |
| 2015/0012818 A1* | 1/2015 | Reichmann et al. ........ 715/236 |

* cited by examiner

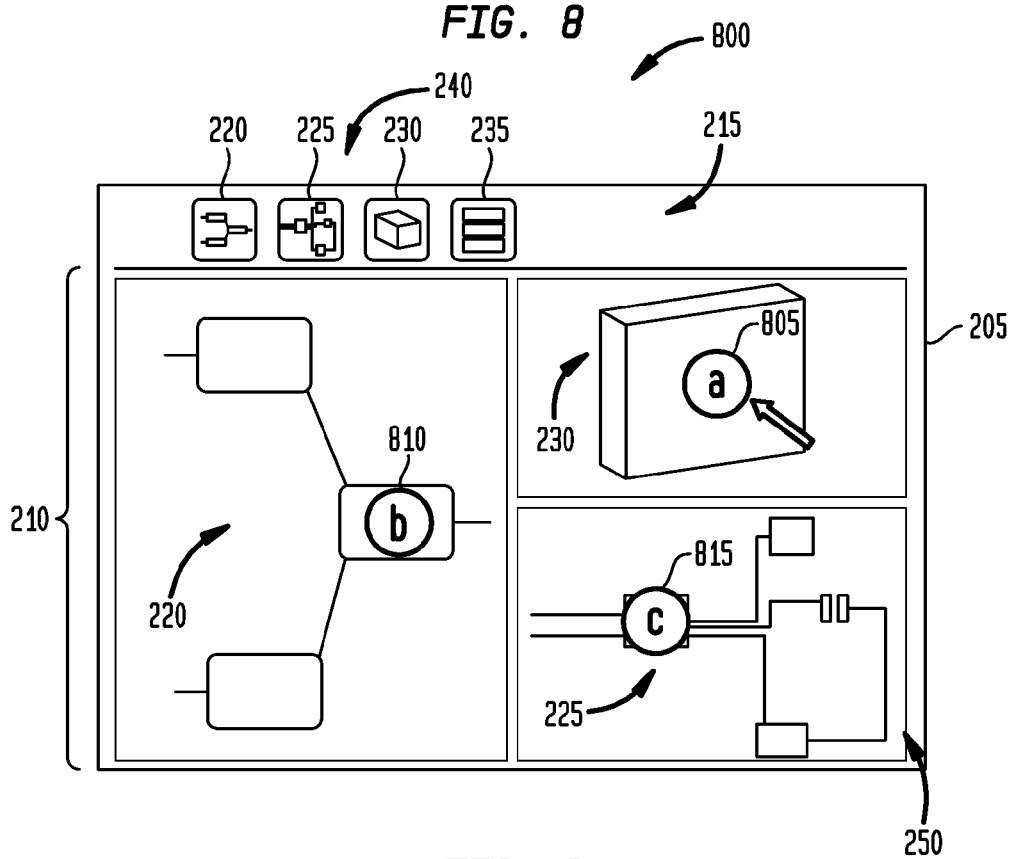
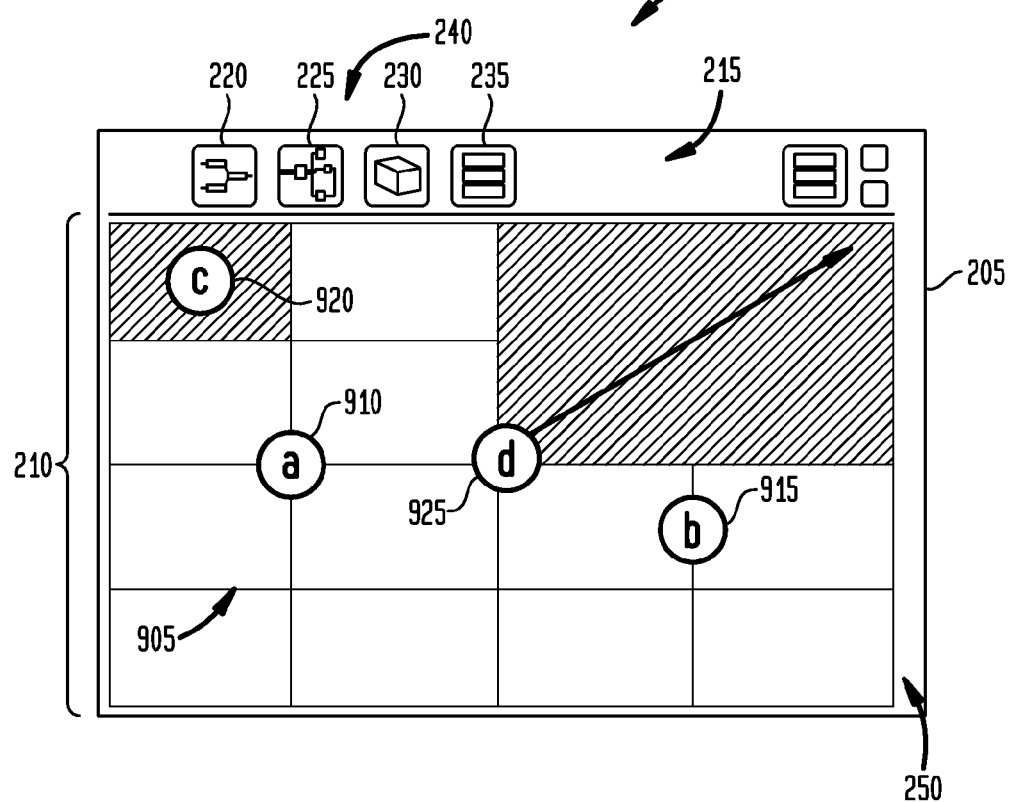

SYSTEM AND METHOD FOR COMBINING INPUT TOOLS INTO A COMPOSITE LAYOUT

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include methods for combining input tools into a composite layout and corresponding systems and computer-readable mediums. A method includes receiving a first tool in a content area of a display, and dynamically adjusting a layout that includes first content associated with the first tool based on a location on a grid associated with the content area into which the first tool is received.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 8 illustrates a display of the user interface that illustrates linking tools together in accordance with disclosed embodiments;

FIG. 9 illustrates a display of the user interface that illustrates different layout options in accordance with disclosed embodiments.

DETAILED DESCRIPTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Figure 1:
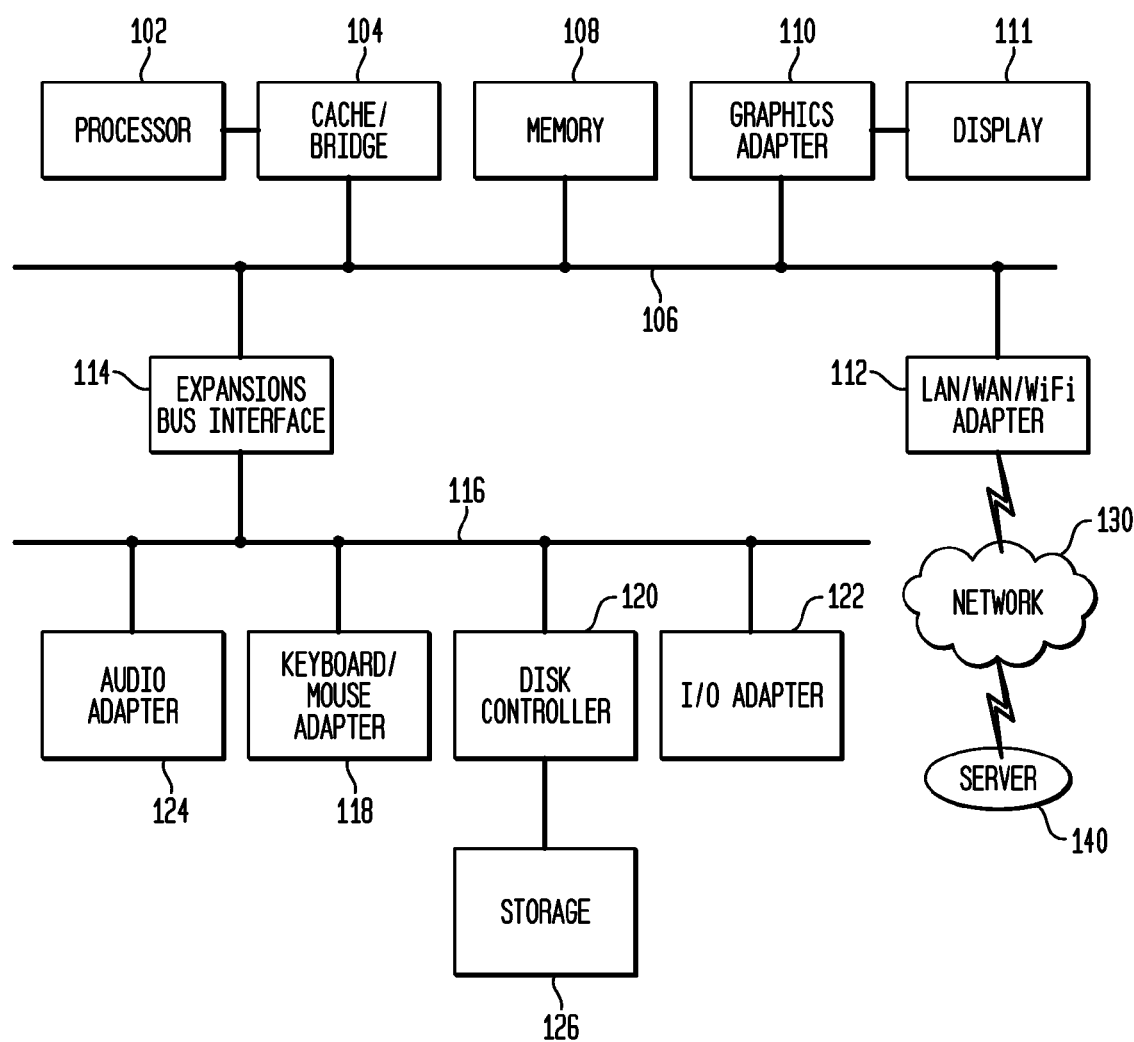
FIG. 1 illustrates a block diagram of a data processing system in which an embodiment can be implemented.

FIG. 1 illustrates a block diagram of a data processing system in which an embodiment can be implemented, for example as a PDM system particularly configured by software or otherwise to perform the processes as described herein, and in particular as each one of a plurality of interconnected and communicating systems as described herein. As another example, a data processing system in which an embodiment can be implemented may be any computing device that is capable of combining input tools into a composite layout within a display. For example, the data processing system may be a server, a desktop computer, or a handheld device, such as a laptop computer, tablet computer, or smart phone. The data processing system illustrated includes a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments provide systems and methods to enable users to leverage the breadth of information available to them by creating compositions of different PLM tools that together represent much or all of the information that may be needed to complete a task or make a decision. In addition to the ability to quickly and easily create such compositions, the present disclosure includes an adaptive layout which reacts to a position of the user's cursor as the user drags a tool into the layout and previews the result showing how the layout will change.

Figure 2:
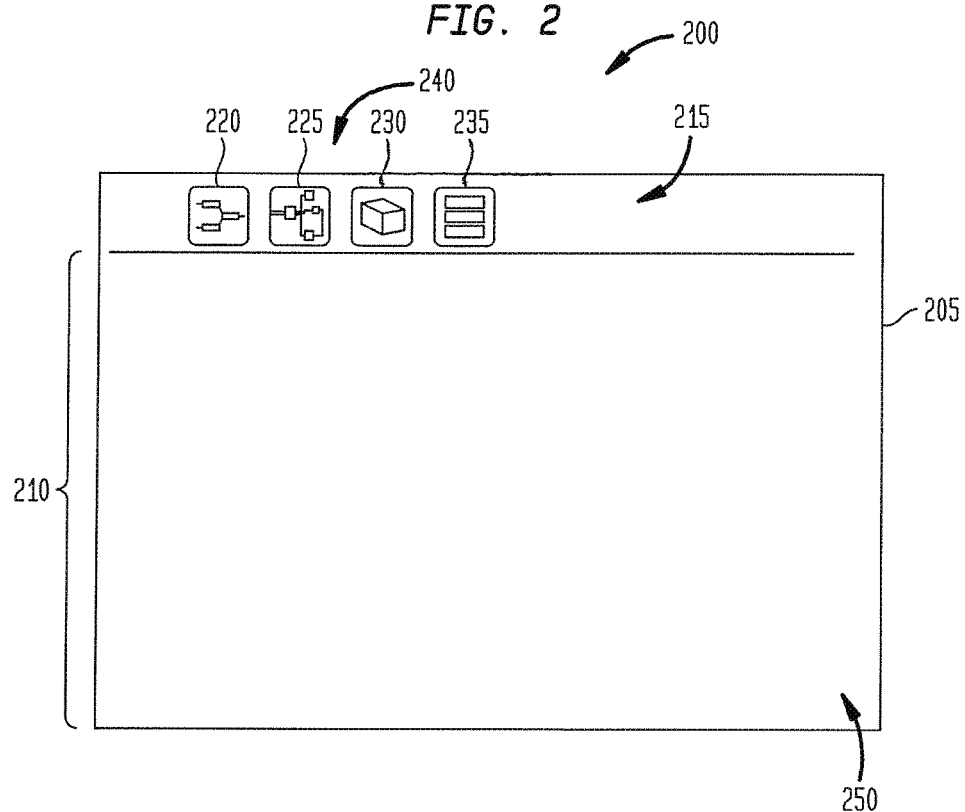
FIG. 2 illustrates a display of an exemplary user interface that illustrates an adaptive layout including a content area configured to be populated with representations of one or more PLM tools that include PLM content in accordance with disclosed embodiments.

FIG. 2 illustrates a display 200 of an exemplary user interface 205 that illustrates an adaptive layout 210 including a content area 250 configured to be populated with representations of one or more PLM tools that include PLM content in accordance with disclosed embodiments. In this illustrative embodiment, the user interface 205 is a user interface for an adaptive PLM layout system that is displayable on the display 111 of FIG. 1. The user interface 205 includes a plurality of icons or thumbnails 240 in a toolbar 215. The plurality of icons 240 corresponds to the one or more PLM tools that include PLM content. The PLM content may include, but is not limited to, network diagrams, electrical diagrams, two-dimensional (2-D) and three-dimensional (3-D) product visuals, results lists, requirements, functional descriptions, or logical descriptions as non-limiting examples. As illustrated, the plurality of icons 240 includes a first icon representative of a first tool 220, a second icon representative of a second tool 225, a third icon representative of a third tool 230, and a fourth icon representative of a fourth tool 235. Although four tools 220-235 are illustrated, it should be understood that the toolbar 215 may contain more or fewer tools.

In the illustrated embodiment, the first tool 220 represents a relationship view tool that may contain text or graphics that describe a relationship between elements of a product or a design. For example, the relationship view tool 220 may contain text describing a requirement for a voltage in a radio of an automobile that would be related to another requirement for a battery system for delivering the particular voltage. There may be other requirements for the physical wires to carry the current between the battery and the radio without overheating, etc. The second tool 225 represents an electrical wiring diagram tool. For example, the electrical wiring diagram tool 225 may include a pictorial representation of an electrical circuit of the radio of the automobile. The third tool 230 represents a three-dimensional (3-D) or computer-aided design (CAD) model tool of a product in 3-D space. For example, the 3-D model tool 230 may represent the radio of the automobile. The fourth tool 235 represents a search tool. For example, the search tool 235 may represent a results list based on a search for information related to the radio of the automobile.

Figure 3:
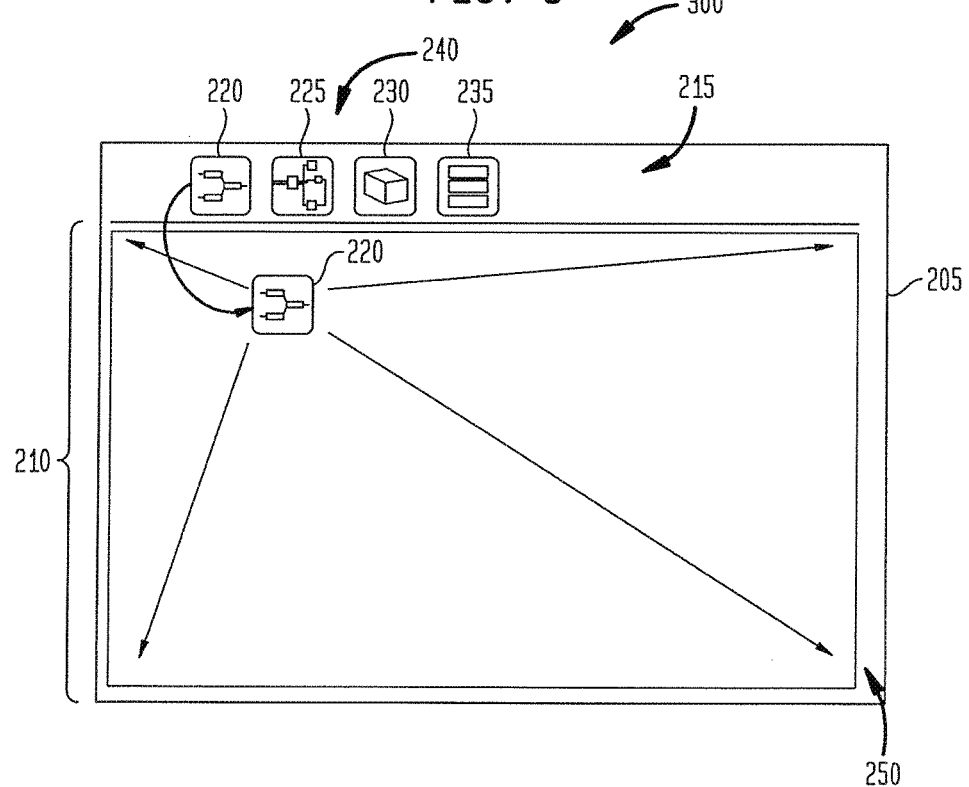
FIG. 3 illustrates a display of the user interface of FIG. 2 that illustrates use of one of the PLM tools in accordance with disclosed embodiments.

FIG. 3 illustrates a display 300 of the user interface 205 of FIG. 2 that illustrates use of one of the PLM tools. In order to use one of the PLM tools, the user may move the desired tool into the content area 250. For example, a user may wish to use the relationship view tool 220. In order to use the relationship view tool 220, the user moves the relationship view tool 220 into the content area 250. To move the relationship view tool 220 into the content area 250, the user may click on the relationship view tool 220 using a mouse or other pointer and may use a drag and drop method to move the relationship view tool 220 into the content area 250. The user may also tap a touchscreen, perform a gesture (such as a swipe gesture or a pinch gesture), engage a mouse wheel, or provide any other suitable input to move the relationship view tool 220 into the content area 250.

In the illustrated example, the user has moved the relationship view tool 220 into the content area 250 and a default placement may be highlighted. For example, a grid (not shown) underlying the content area 250 may respond to the pending addition of the relationship view tool 220 and highlight the placement of the relationship view tool 220. Dragging or moving the relationship view tool 220 before the relationship view tool 220 is dropped may cause the highlighting to adjust to highlight suggested grid cells defined by grid lines (not shown) into which content associated with the relationship view tool 220 will be placed. For example, as described in further detail with respect to FIG. 9, the layout 210 may dynamically adjust and react to a position of the user's cursor as the user drags a tool from the toolbar 215 into the content area 250 and preview the result showing how the layout 210 will change based on dropping a new tool (or an existing tool in the layout) in one of several drop zones in the content area 250. As such, the user is able to preview different layout possibilities. For example, the user may drag a particular tool into a specific area of the content area 250. In addition, the user may hover over a grid line, which may imply that the entire grid space will be used for placement of the particular tool.

Figure 4:
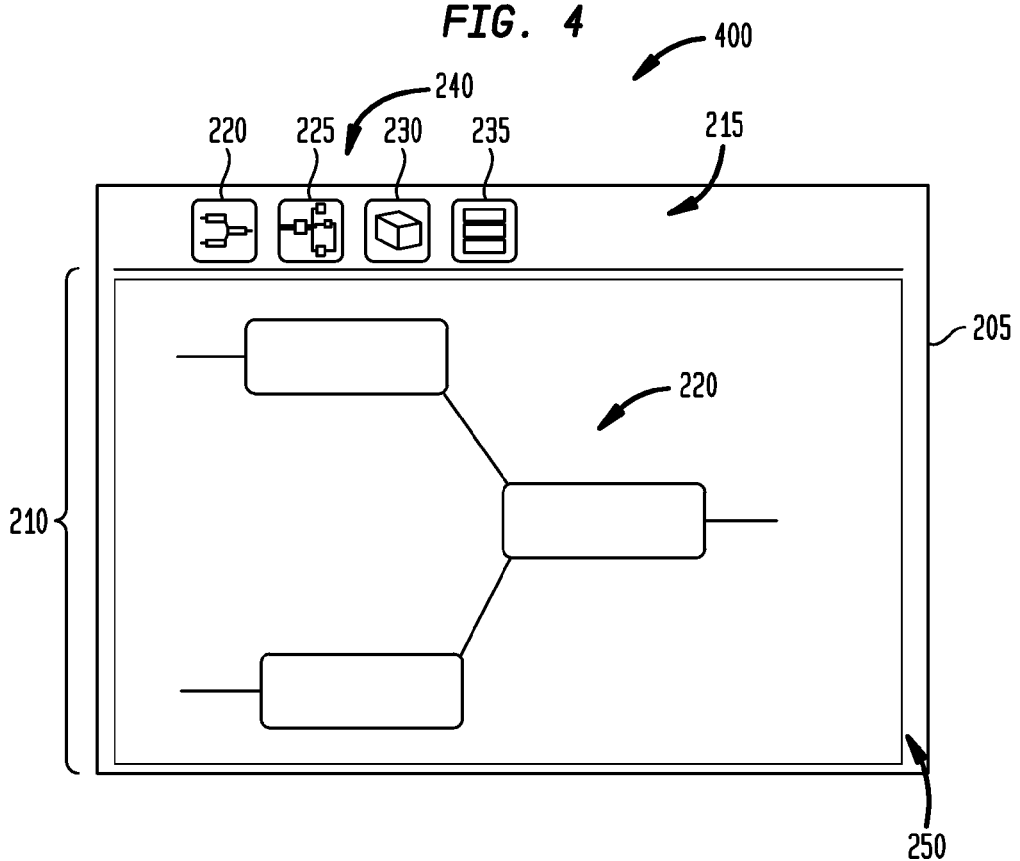
FIG. 4 illustrates a display of the user interface that illustrates an application or the content associated with a tool of FIG. 3 in accordance with disclosed embodiments.

FIG. 4 illustrates a display 400 of the user interface 205 that illustrates an application or the content associated with the "dragged" tool of FIG. 3. For example, once placed (e.g., dropped) in the content area 250, the layout 210 shows the application or content associated with the relationship view tool 220. In the illustrated embodiment, the relationship view tool 220 takes up substantially the whole of the content area 250.

Figure 5:
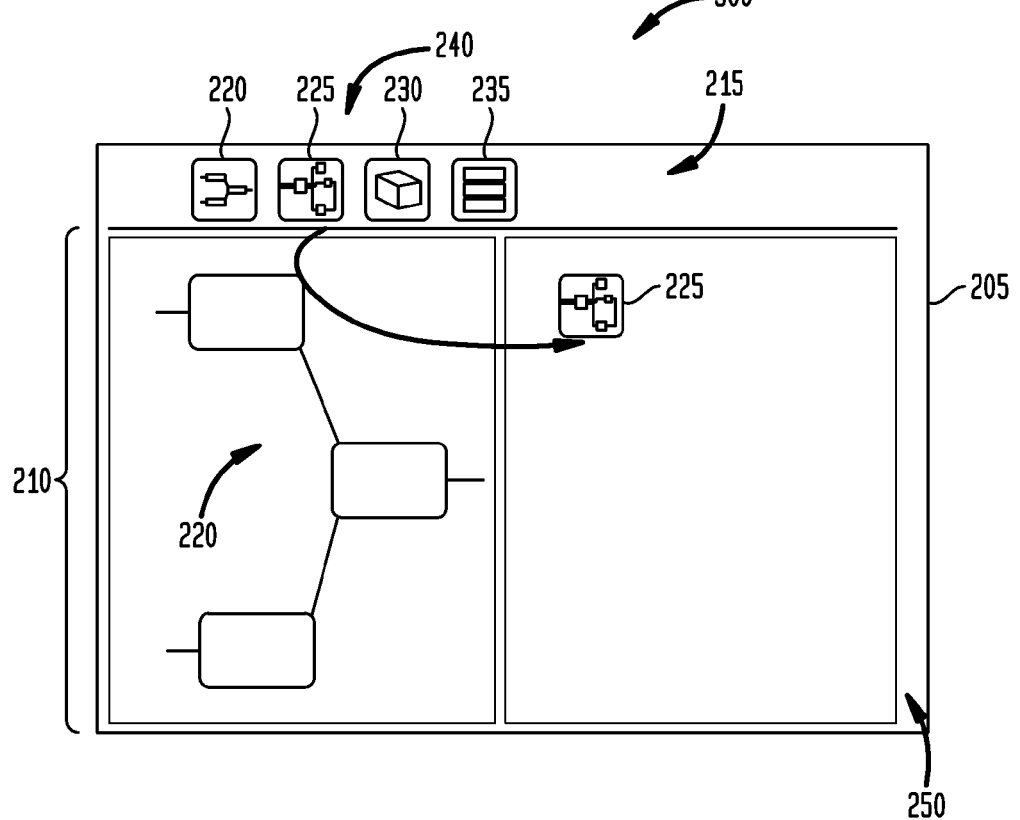
FIG. 5 illustrates a display of the user interface that illustrates adding a second tool into the content area of FIG. 4 in accordance with disclosed embodiments.

FIG. 5 illustrates a display 500 of the user interface 205 that illustrates adding a second tool into the content area 250 of FIG. 4. In the illustrated example, the user has moved the electrical wiring diagram tool 225 into the content area 250 and a default placement may be highlighted. For example, a grid (not shown) underlying the content area 250 may respond to the pending addition of the electrical wiring diagram tool 225 and highlight the placement of the electrical wiring diagram tool 225. Dragging or moving the electrical wiring diagram tool 225 before the electrical wiring diagram tool 225 is dropped may cause the highlighting to adjust to highlight suggested grid cells defined by grid lines (not shown) into which content associated with the electrical wiring diagram tool 225 will be placed, providing a preview of changes that will occur in the layout 210. In the illustrated example, the layout 210 has dynamically adjusted based on a position of the user's cursor as the user drags the electrical wiring diagram tool 225 from the toolbar 215 into the content area 250 such that the existing relationship view tool 220 takes up approximately one half of the content area 250 and the newly added electrical wiring diagram tool 225 takes up approximately one half of the content area 250 as the layout 210 makes room for the electrical wiring diagram tool 225.

Figure 6:
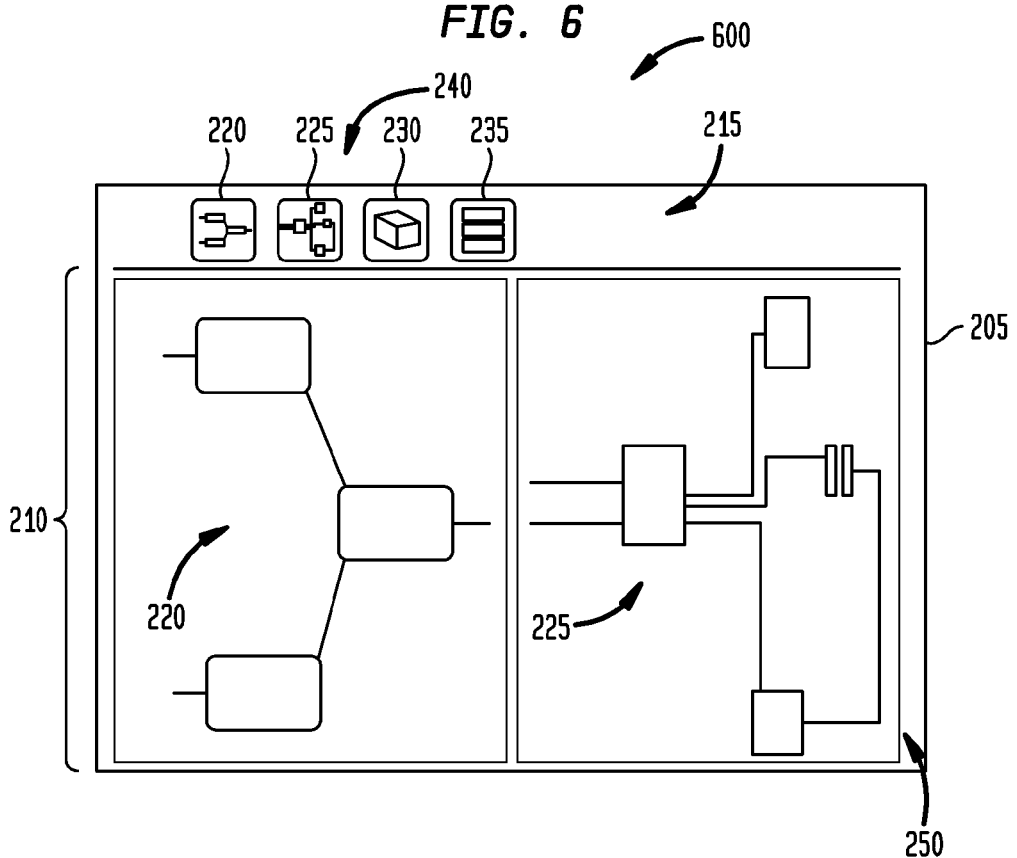
FIG. 6 illustrates a display of the user interface that illustrates an application or the content associated with the electrical wiring diagram tool of FIG. 5 in accordance with disclosed embodiments.

FIG. 6 illustrates a display 600 of the user interface 205 that illustrates an application or the content associated with the "dragged" electrical wiring diagram tool 225 of FIG. 5. For example, once the electrical wiring diagram tool 225 is placed (e.g., dropped) in the content area 250, the layout 210 shows the application or content associated with the electrical wiring diagram tool 225 along with the content associated with the relationship view tool 220 as previously described with respect to FIG. 4. In the illustrated embodiment, the relationship view tool 220 takes up one half of the content area 250 and the electrical wiring diagram tool 225 takes up the other half of the content area 250. As illustrated, the user is able to interact with both the relationship view tool 220 and the electrical wiring diagram tool 225 as needed. By displaying both the relationship view tool 220 and the electrical wiring diagram tool 225, the user is able to interact dynamically between different views of the same or related data. For example, the user may be able to cross probe logical and physical networks of data in a mechatronic system. In addition, the user may be able to compare search results or visual reports, or traverse a visual representation of a product and view the related requirements in a network view highlighted in real time.

Figure 7:
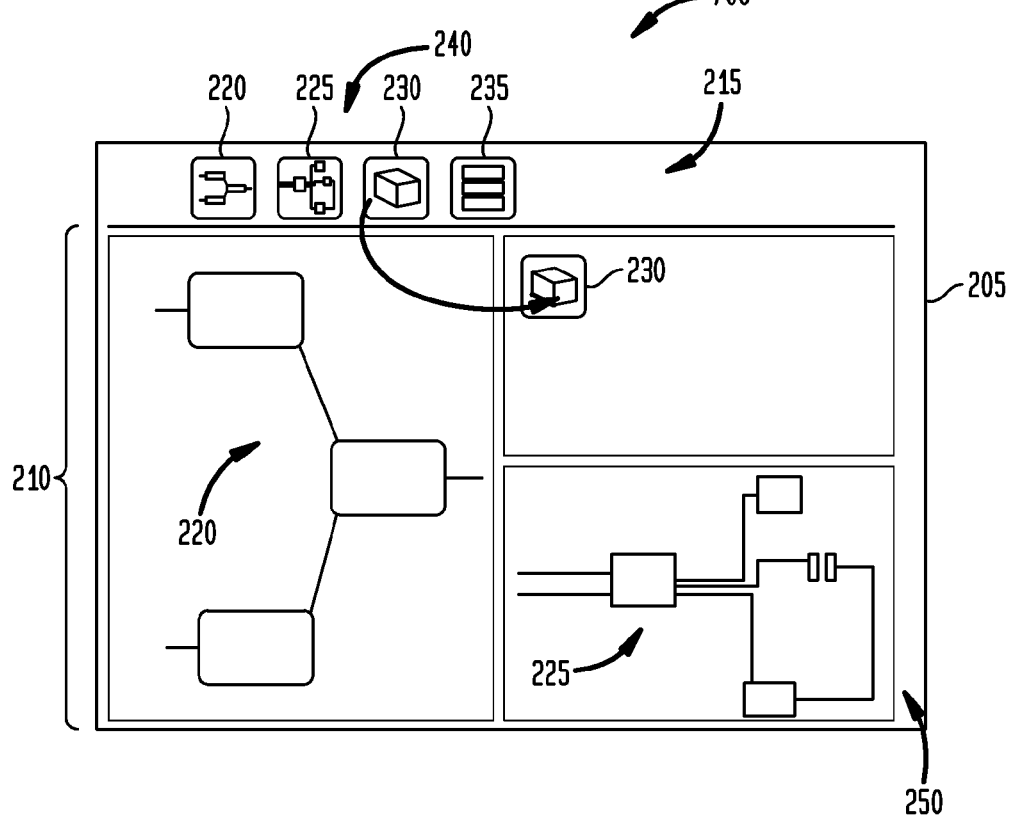
FIG. 7 illustrates a display of the user interface that illustrates adding a third tool into the content area of FIG. 6 in accordance with disclosed embodiments.

FIG. 7 illustrates a display 700 of the user interface 205 that illustrates adding a third tool into the content area 250 of FIG. 6. In the illustrated example, the user has moved the 3-D model tool 230 into the content area 250 and a default placement may be highlighted. For example, a grid (not shown) underlying the content area 250 may respond to the pending addition of the 3-D model tool 230 and highlight the placement of the 3-D model tool 230. Dragging or moving the 3-D model tool 230 before the 3-D model tool 230 is dropped may cause the highlighting to adjust to highlight suggested grid cells defined by grid lines (not shown) into which content associated with the 3-D model tool 230 will be placed, providing a preview of changes that will occur in the layout 210. In the illustrated example, the layout 210 has dynamically adjusted based on a position of the user's cursor as the user drags the 3-D model tool 230 from the toolbar 215 into the content area 250 such that the existing relationship view tool 220 takes up approximately one half of the content area 250, the existing electrical wiring diagram tool 225 takes up approximately one fourth of the content area 250, and the 3-D model tool 230 takes up approximately one fourth of the content area 250 as the layout 210 makes room for the 3-D model tool 230.

FIG. 8 illustrates a display 800 of the user interface 205 that illustrates an application or the content associated with the "dragged" 3-D model tool 230 of FIG. 7 after placement alongside the existing relationship view tool 220 and the existing electrical wiring diagram tool 225. For example, once the 3-D model tool 230 is placed (e.g., dropped) in the content area 250, the layout 210 shows the application or content associated with the 3-D model tool 230 along with the content associated with the electrical wiring diagram tool 225 and along with the content associated with the relationship view tool 220.

In addition, FIG. 8 illustrates "linking" tools in the layout 210 together such that the linked tools can share "context" and behave as a single "composite tool" from a user's perspective. Context refers to dynamically determining and displaying data most relevant to a user based on the user's role and ongoing interactions with the system. The "context," as used herein, can include one or more of the following characteristics: configuration (effectivity, product options, revision rule); search that retrieves or includes only some objects from a configuration; navigation that allows the user to drill down into an area of interest; and a visual report whose output can be used to refine a context. For example, the user may highlight a particular object in one of the visible tool views and if the same object is present in one or more of the other visible tool views it is also highlighted in a manner appropriate to that tool. To illustrate, the user may highlight a particular object in the view of the 3-D model tool 230, such as an electrical transformer 805. If the other tools in the layout 210 (e.g., the relationship view tool 220 and the electrical wiring diagram tool 225) are "linked" with the 3-D model tool 230, then the effect of highlighting the electrical transformer 805 in the view of the 3-D model tool 230 is that the layout 210 highlights a requirement 810 in the view of the relationship view tool 220 associated with the electrical transformer 805 and highlights a representation of the electrical transformer 815 in the view of the electrical wiring diagram tool 225. As such, the user is able to interact with a product from a systems engineering perspective across multiple disciplines.

Although three tools 220-230 are illustrated as having been added to the layout 210 of FIGS. 7 and 8 for ease of explanation, it should be understood that the layout 210 may contain more or fewer tools. For example, the number of tools in the layout 210 may vary between 1 and N, with no upper limit other than a resolution of the display 111 of FIG. 1 and/or user eyesight.

FIG. 9 illustrates a display 900 of the user interface 205 that illustrates different layout options. A grid 905 underlying the content area 250 may respond to user actions such that the layout 210 dynamically adjusts based on the user actions, allowing the user to preview different layout possibilities. For example, the layout 210 may dynamically adjust and react to a position of the user's cursor as the user drags a tool from the toolbar 215 into the content area 250. To illustrate, the user may drag a tool from the toolbar 215 and hover over a grid line or an intersection of grid lines, such as shown at reference "a" 910, which may imply that the entire grid space will be used for placement of the particular tool. In this case the previous content of the content area 250 may be closed back into the toolbar 215. In addition, the user may drag a tool from the toolbar 215 and hover over a grid line, such as shown at reference "b" 915, which may imply that the layout 210 dynamically adjust such that all displayed tools share equal space in the content area 250. In addition, the user may drag a tool from the toolbar 215 into a specific area of the content area 250 without changing existing content of the content area, such as shown at reference "c" 920. This may cause existing content to be overlaid in a "picture in picture" manner, such that the "new" content is displayed in an inset window that overlays the existing content. In addition, the user may resize a tool after placement by dragging the tool within the grid 905 as shown at reference "d" 925. Once the user has created a layout that suits his or her purpose, the layout may be saved, such as to the toolbar 215, for later use. The saved layouts may be shared with other users such that decision making information can be easily shared in a single package of relevant information.

Figure 10:
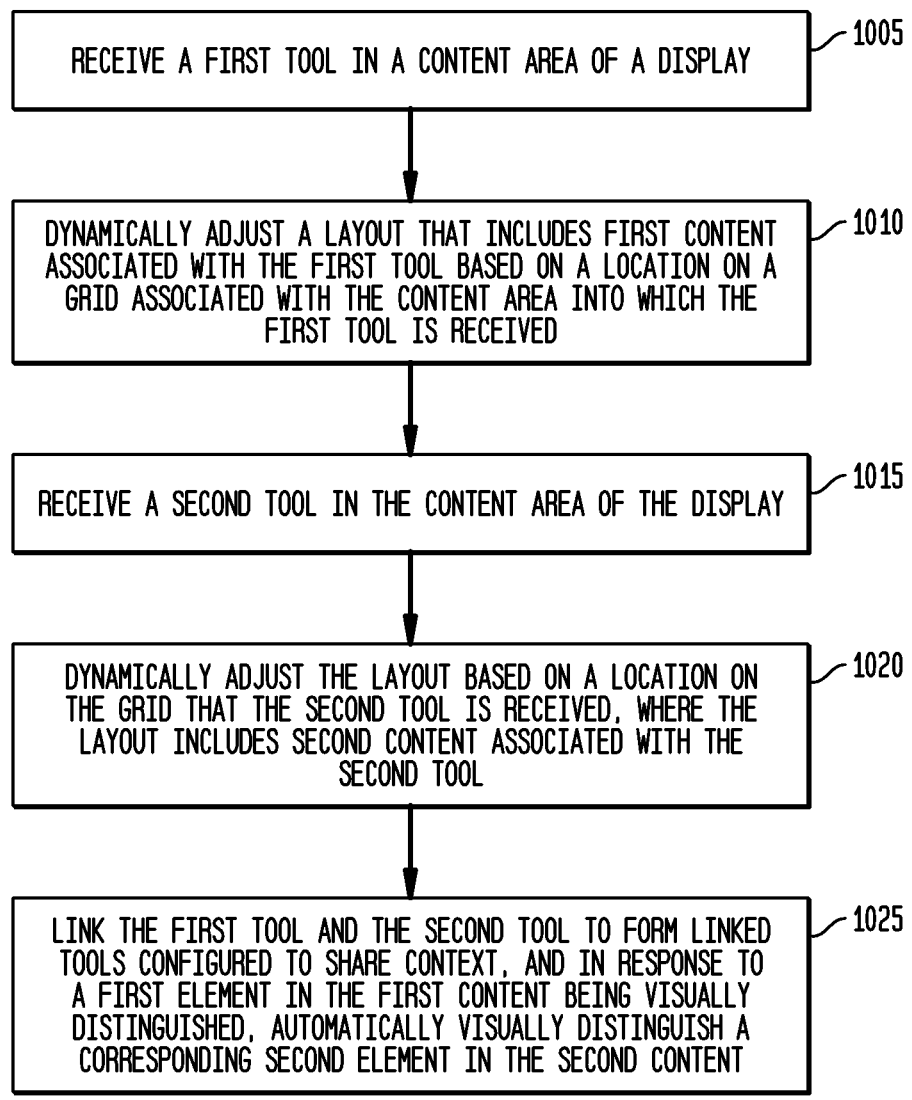
FIG. 10 illustrates a flowchart of a process for combining input tools into a composite layout in accordance with disclosed embodiments.

FIG. 10 illustrates a flowchart of a process in accordance with disclosed embodiments that may be performed, for example, by a PLM or PDM system.

The system receives a first tool in a content area of a display, at step 1005. "Receiving," as used herein, can include loading from storage, receiving from another device or process, receiving via an interaction with a user, and otherwise. For example, as part of this step, the system may receive a user input including moving the desired tool, such as the relationship view tool 220 of FIG. 3, from the toolbar 215 of FIG. 3 into the content area 250 of FIG. 3.

The system dynamically adjusts a layout that includes first content associated with the first tool based on a location on a grid associated with the content area that the first tool is dropped, at step 1010. For example, the layout 210 of FIGS. 3-9 may dynamically adjust and react to a position of the user's cursor as the user drags the desired tool from the toolbar 215 into the content area 250. The grid 905 of FIG. 9 underlying the content area 250 may respond to user actions such that the layout 210 dynamically adjusts based on the user actions, allowing the user to preview different layout possibilities. For example, the layout 210 may dynamically adjust and react to a position of the user's cursor as the user drags a tool from the toolbar 215 into the content area 250. To illustrate, the user may drag a tool from the toolbar 215 and hover over a grid line or an intersection of grid lines, such as shown at reference "a" 910, which may imply that the entire grid space will be used for placement of the particular tool, such as the relationship view tool shown in FIG. 4.

The system may receive a second tool in the content area of the display, at step 1015. For example, the user may drag or move the electrical wiring diagram tool 225 of FIG. 5 into the content area 250. The system may dynamically adjust the layout based on a location on the grid that the second tool is dropped, where the layout includes second content associated with the second tool, at step 1020. For example, dragging the electrical wiring diagram tool 225 over a grid line as illustrated in the grid 905 of FIG. 9 may cause the layout 210 of FIG. 5 to dynamically adjust such that the existing relationship view tool 220 of FIG. 5 takes up approximately one half of the content area 250 instead of the entirety of the content area 250 as shown in FIG. 4, and the newly added electrical wiring diagram tool 225 takes up approximately one half of the content area 250 as the layout 210 makes room for the electrical wiring diagram tool 225.

The system may link the first tool and the second tool to form linked tools configured to share context, and in response to a first element in the first content being visually distinguished, the system may automatically visually distinguish a corresponding second element in the second content, at step 1025. For example, as part of this step, the system may receive a user input including initiating a linking operation to connect two or more tools together allowing the linked tools to share context such as selection. The user may initiate the linking operation via a linking symbol in the toolbar 215. For example, after initiating the linking operation, the user may highlight the electrical transformer 805 of FIG. 8 in the view of the 3-D model tool 230, and the layout 210 may highlight a requirement 810 in the view of the relationship view tool 220 associated with the electrical transformer 805 and may highlight a representation of the electrical transformer 815 in the view of the electrical wiring diagram tool 225. As such, the user is able to interact with a product from a systems engineering perspective across multiple disciplines.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for combining input tools into a composite layout within a display, the method performed by a data processing system and comprising:
   receiving, by the data processing system, a first tool in a content area of the display;
   dynamically adjusting, by the data processing system, a layout that includes first content associated with the first tool in accordance with movement of the first tool within the content area prior to dropping the first tool into the content area and in accordance with a location of the first tool on a grid associated with the content area into which the first tool is received, wherein the grid responds to pending addition of the first tool by highlighting a placement of the first tool within the content area, thereby allowing a user to preview how the layout will change based on dropping the first tool into the content area; and
   in response to the user selection of an object in a first view associated with the first content, highlighting the object in the first view and also highlighting the same object any other view in which that object appears.

2. The method of claim 1, further comprising:
   receiving a second tool in the content area of the display; and
   dynamically adjusting the layout in accordance with movement of the second tool within the content area prior to dropping the second tool into the content area and in accordance with a location of the second tool on the grid, wherein the grid responds to pending addition of the second tool by highlighting a placement of the second tool within the content area, thereby allowing a user to preview how the layout will change based on dropping the second tool into the content area, wherein the layout includes second content associated with the second tool.

3. The method of claim 2, further comprising:
   linking the first tool and the second tool after the first tool and the second tool have been dropped to form linked tools configured to share context; and
   in response to visually distinguishing a first element in the first content, automatically visually distinguishing a corresponding second element in the second content.

4. The method of claim 3, further comprising:
   receiving a third tool in the content area of the display; and
   dynamically adjusting the layout in accordance with movement of the third tool within the content area prior to dropping the third tool into the content area and in accordance with a location of the third tool on the grid, wherein the grid responds to pending addition of the third tool by highlighting a placement of the third tool within the content area, thereby allowing a user to preview how the layout will change based on dropping the third tool into the content area, wherein the layout includes third content associated with the third tool.

5. The method of claim 4, further comprising:
   linking the third tool with the first tool and the second tool after the third tool has been dropped; and
   in response to visually distinguishing the first element in the first content, automatically visually distinguishing a corresponding third element in the third content.

6. The method of claim 2, further comprising:
   storing the layout for future retrieval and use.

7. The method of claim 1, wherein moving the first tool before the first tool is dropped causes the highlighting to adjust to highlight suggested grid cells defined by grid lines of the grid into which the first content will be placed.

8. A data processing system for combining input tools into a composite layout within a display comprising:
   a processor; and
   an accessible memory, the data processing system particularly configured to:
      receive a first tool in a content area of the display; and
      dynamically adjust a layout that includes first content associated with the first tool in accordance with movement of the first tool within the content area prior to dropping the first tool into the content area and in accordance with a location of the first tool on a grid associated with the content area into which the first tool is received, wherein the grid responds to pending addition of the first tool by highlighting a placement of the first tool within the content area, thereby allowing a user to preview how the layout will change based on dropping the first tool into the content area; and
      in response to the user selection of an object in a first view associated with the first content, highlight the object in the first view and also highlight the same object any other view in which that object appears.

9. The data processing system of claim 8, wherein the data processing system is further configured to:
   receive a second tool in the content area of the display; and
   dynamically adjust the layout in accordance with movement of the second tool within the content area prior to dropping the second tool into the content area and in accordance with a location of the second tool on the grid, wherein the grid responds to pending addition of the second tool by highlighting a placement of the second tool within the content area, thereby allowing a user to preview how the layout will change based on dropping the second tool into the content area, wherein the layout includes second content associated with the second tool.

10. The data processing system of claim 9, wherein the data processing system is further configured to:
    link the first tool and the second tool after the first tool and the second tool have been dropped to form linked tools configured to share context; and
    in response to a first element in the first content being visually distinguished, automatically visually distinguish a corresponding second element in the second content.

11. The data processing system of claim 10, wherein the data processing system is further configured to:
    receive a third tool in the content area of the display; and
    dynamically adjust the layout in accordance with movement of the third tool within the content area prior to dropping the third tool into the content area and in accordance with a location of the third tool on the grid, wherein the grid responds to pending addition of the third tool by highlighting a placement of the third tool within the content area, thereby allowing a user to preview how the layout will change based on dropping the third tool into the content area, wherein the layout includes third content associated with the third tool.

12. The data processing system of claim 11, wherein the data processing system is further configured to:
    link the third tool with the first tool and the second tool after the third tool has been dropped; and
    in response to the first element in the first content being visually distinguished, automatically visually distinguish a corresponding third element in the third content.

13. The data processing system of claim 9, wherein the data processing system is further configured to:
  store the layout for future retrieval and use.

14. The data processing system of claim 13, wherein the data processing system is further configured to:
  share the stored layout with another user.

15. A non-transitory computer-readable medium encoded with executable instructions for combining input tools into a composite layout within a display that, when executed, cause one or more data processing systems to:
  receive a first tool in a content area of the display;
  dynamically adjust a layout that includes first content associated with the first tool in accordance with movement of the first tool within the content area prior to dropping the first tool into the content area and in accordance with a location of the first tool on a grid associated with the content area into which the first tool is received, wherein the grid responds to pending addition of the first tool by highlighting a placement of the first tool within the content area, thereby allowing a user to preview how the layout will change based on dropping the first tool into the content area; and
  in response to the user selection of an object in a first view associated with the first content, highlight the object in the first view and also highlight the same object any other view in which that object appears.

16. The computer-readable medium of claim 15 further comprising instructions that cause the data processing system to:
  receive a second tool in the content area of the display; and
  dynamically adjust the layout in accordance with movement of the second tool within the content area prior to dropping the second tool into the content area and in accordance with a location of the second tool on the grid, wherein the grid responds to pending addition of the second tool by highlighting a placement of the second tool within the content area, thereby allowing a user to preview how the layout will change based on dropping the second tool into the content area, wherein the layout includes second content associated with the second tool.

17. The computer-readable medium of claim 16 further comprising instructions that cause the data processing system to:
  link the first tool and the second tool after the first tool and the second tool have been dropped to form linked tools configured to share context; and
  in response to a first element in the first content being visually distinguished, automatically visually distinguish a corresponding second element in the second content.

18. The computer-readable medium of claim 17 further comprising instructions that cause the data processing system to:
  receive a third tool in the content area of the display; and
  dynamically adjust the layout in accordance with movement of the third tool within the content area prior to dropping the third tool into the content area and in accordance with a location of the third tool on the grid, wherein the grid responds to pending addition of the third tool by highlighting a placement of the third tool within the content area, thereby allowing a user to preview how the layout will change based on dropping the third tool into the content area, wherein the layout includes third content associated with the third tool.

19. The computer-readable medium of claim 18, further comprising instructions that cause the data processing system to:
  link the third tool with the first tool and the second tool after the third tool has been dropped; and
  in response to the first element in the first content being visually distinguished, automatically visually distinguish a corresponding third element in the third content.

20. The computer-readable medium of claim 16, further comprising instructions that cause the data processing system to:
  store the layout for future retrieval and use; and
  share the stored layout with another user.

* * * * *